(12) United States Patent
Bao et al.

(10) Patent No.: US 8,125,282 B2
(45) Date of Patent: Feb. 28, 2012

(54) DUAL-BAND COUPLED VCO

(75) Inventors: Mingquan Bao, Västra Frölunda (SE); Björn Albinsson, Göteborg (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 28 days.

(21) Appl. No.: 12/739,012

(22) PCT Filed: Oct. 23, 2007

(86) PCT No.: PCT/SE2007/050770
§ 371 (c)(1),
(2), (4) Date: Apr. 21, 2010

(87) PCT Pub. No.: WO2009/054760
PCT Pub. Date: Apr. 30, 2009

(65) Prior Publication Data
US 2010/0271086 A1    Oct. 28, 2010

(51) Int. Cl.
*H03B 5/18*    (2006.01)

(52) U.S. Cl. .............. 331/117 D; 331/107 SL; 331/55; 331/48

(58) Field of Classification Search ............. 331/117 R, 331/117 FE, 117 D, 167, 96, 107 DP, 107 SL, 331/46, 48, 55, 179, 181, 50
See application file for complete search history.

(56) References Cited

U.S. PATENT DOCUMENTS

| 5,629,652 A * | 5/1997 | Weiss ................... 331/108 B |
| 7,295,076 B2 * | 11/2007 | Kim et al. ..................... 331/2 |
| 2008/0007366 A1 * | 1/2008 | Bevilacqua et al. .......... 331/179 |

* cited by examiner

*Primary Examiner* — Ryan Johnson

(57) ABSTRACT

In a dual band capable voltage controlled oscillator VCO circuit comprising two voltage controlled oscillator units VCO1, VCO2, the voltage controlled oscillator units VCO1, VCO2 are synchronized and connected via at least two coupled transmission lines TL1, TL2, the transmission lines (TL1, TL2) are arranged to operate according to one of two modes to enable varying a combined inductance of the synchronized oscillator units VCO1, VCO2 and the oscillation frequency for the voltage controlled oscillator circuit VCO.

8 Claims, 12 Drawing Sheets

Frequency Selective Network (a)　　　　　　　　　　(b)

DUAL-BAND COUPLED VCO

TECHNICAL FIELD

The present invention concerns voltage controlled oscillators in general; especially a dual-band voltage controlled oscillator (VCO) with improved phase noise performance

BACKGROUND

The development of wireless communication systems has increased the demand for monolithically integrated, low-cost and low-phase-noise voltage controlled oscillators (VCOs). At the same time, the development for several communication standards utilizing different frequency bands has pushed researchers to develop multi-band as well as multi-stand transceivers. This has, in turn, pushed researchers to look for multi-band VCOs, especially dual-band VCOs. One of the major demands of such transceivers is the need for multi-band VCOs with good phase noise performance.

Known multi-band VCOs have been realized according to a variety of approaches. One known approach is to use switched capacitors or inductors in a LC resonator, as shown in FIG. 1a-b [1], [2]. The inductance or capacitance of the resonator is thus varied by utilizing switchers $V_{switch}$, consequently also the oscillation frequency-band is varied. Alternatively, the total inductance of the resonator can be varied by switching mutual inductance within a resonator, as shown in FIG. 2 and FIG. 3, [3], [4].

All the above described known solutions suffer from a common problem. The parasitic resistance of the switcher is it via actual switchers or switched mutual inductance degrades the quality factor Q of the resonator. Consequently, the phase noise performance of the entire VCO is degraded. Even though increasing the physical size of the switcher can reduce the parasitic resistance to a certain extent, the large parasitic capacitance results in a decrease of the tuning frequency range.

Yet another known approach has been to build two different frequency VCOs in combination, and let the two VCO's share part of the resonator. By switching the bias current, one VCO works and the other stands by according to [5]. For example, as shown in FIG. 4, there are two VCOs. The resonator of VCO1 consists of one port of a transformer and capacitors, while the resonator of VCO2 consists of two ports of the transformer and capacitors. Thus, two voltage controlled oscillators VCO1, VCO2 have different oscillation frequencies, and they are controlled by a switched current bias. Another example is shown in FIG. 5, where either of the two voltage controlled oscillators VCO1, VCO2 can be turned on by switching the respective bias current $I_d$ and $I_c$. Those two oscillators oscillate at a respective frequency, thus a dual band VCO is obtained.

For the above described switched bias current, only one VCO works at any one time, but the inactive or stand-by VCO is still connected to the resonator, consequently, the parasitic resistance and capacitance of the active devices in the switched-off VCO has certain undesired effects on the operating VCOs.

Due the above problems, there is a need for an improved dual band voltage controlled oscillator with reduced phase noise performance.

SUMMARY

An object of the present invention is to provide an improved dual-band voltage controlled oscillator.

A further object of the present invention is to provide a dual-band voltage controller oscillator with reduced phase noise performance.

According to a basic embodiment a dual band capable voltage controlled oscillator circuit VCO according to the invention comprises two voltage controlled oscillators VCO1, VCO2, wherein the voltage controlled oscillator units VCO1, VCO2 are synchronized and connected via at least two coupled transmission lines TL1, TL2. The transmission lines TL1, TL2 are arranged to operate according to either one of two modes to enable varying a combined inductance of the synchronized oscillator units VCO1, VCO2 and thereby vary the oscillation frequency for the voltage controlled oscillator circuit VCO.

Advantages of the present invention comprise:
  a dual band voltage controlled oscillator with improved phase noise performance.

BRIEF DESCRIPTION OF THE DRAWINGS

The invention, together with further objects and advantages thereof, may best be understood by referring to the following description taken together with the accompanying drawings, in which.

ABBREVIATIONS

CMOS Complementary Metal Oxide Semiconductor
IC Integrated Circuit
TL Transmission Line
VCO Voltage Controlled Oscillator

DETAILED DESCRIPTION

The present invention will be discussed in the context of a general integrated circuit scheme applicable to any communication technology utilizing dual or even multiple frequency bands. The proposed VCO topology can be implemented in any semiconductor technology, e.g., CMOS, bipolar, Silicon, GaAs etc. It can be fully integrated on a chip but can also be made with discrete components or a mixture of ICs and discrete components.

The total inductance $L_i$ (i=1,2) of a coupled transmission line pair is determined by the self-inductance $L_{s,j}$ and by their mutual inductance M (see Appendix 1 for further description of mutual inductance and the dot convention). The transmission lines have two modes of operation, namely even and odd mode. Accordingly, for operation in even mode, $L_i=L_{s,j}+M$; and operation in odd mode $L_i=L_{s,j}-M$. Consequently, by controlling the operation mode of the coupled transmission lines TL, the total inductance can be varied; consequently, change the oscillation frequency of a coupled VCOs according to Equation 1.

$$f_0 = \frac{1}{2\pi\sqrt{(L_{s,i} \pm M)C}} \quad (1)$$

The present invention generally concerns a dual-band voltage controlled oscillator VCO based on two coupled voltage controlled oscillators VCO1, VCO2.

The two oscillators are synchronized via coupled transmission lines TL. By switching even or odd mode of the coupled transmission lines, the inductance of the LC resonator for each oscillator is varied, so is the oscillation frequency band for the combined voltage controlled oscillator. Furthermore, the coupled VCOs have a better phase noise performance than known single VCOs.

The present invention discloses various embodiments of a general improved dual band VCO comprising at least two coupled, synchronized voltage controlled oscillators VCO1, VCO2. The oscillators are coupled via a mutual inductance coupled transmission line pair TL1, TL2, arranged to enable switching the operational mode of the coupled transmission line pair TL1, TL2 to provide a dual mode of operation of the voltage controlled oscillator.

Figure 6:
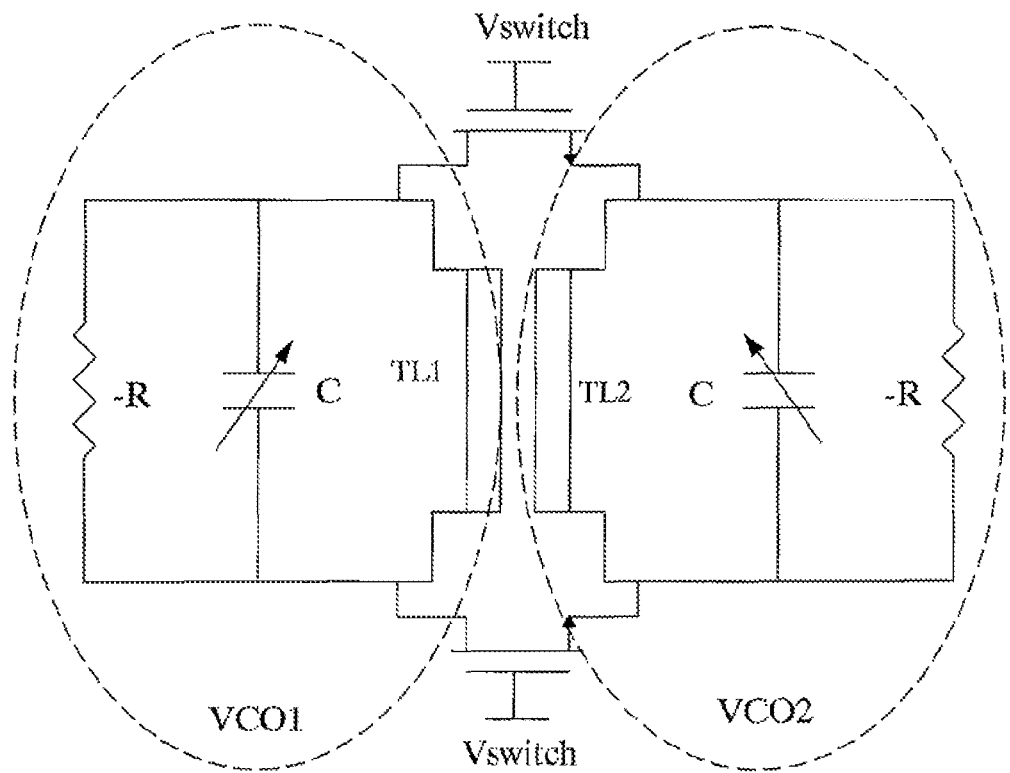
FIG. 6 is an illustration of an embodiment of a dual band VCO according to the present invention.
Figure 7:
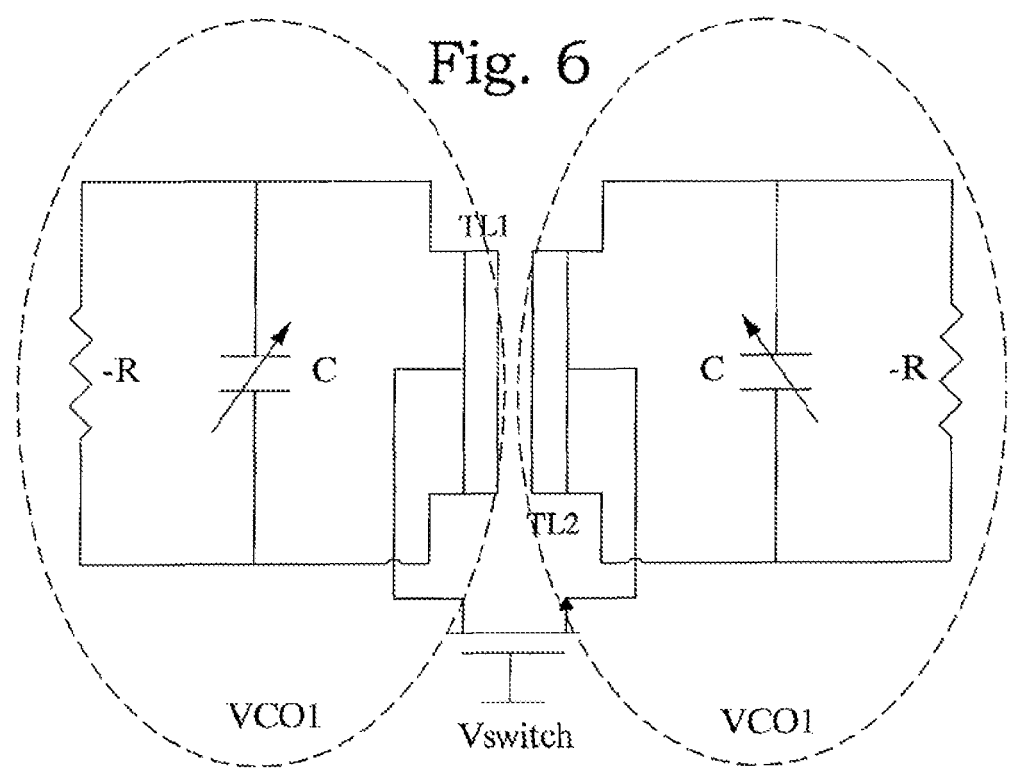
FIG. 7 is an illustration of another embodiment of a dual band VCO according to the present invention.

According to one embodiment, with reference to FIG. 6 and FIG. 7, the switching action is enabled by means of switchers $V_{switch}$ across the coupled transmission line pair TL1, TL2. In the illustrated schematic, the respective voltage controlled oscillators VCO1 and VCO2 are represented by the negative resistor -R, and capacitor C, as well as coupled transmission lines TL1, TL2 in the proposed VCO, Here, -R represents the negative resistance provided by the power amplifier of the respective voltage controlled oscillators VCO1, VCO2. The switchers are located at the coupled transmission lines terminals (FIG. 6) or at a central portion of the coupled transmission line pair (FIG. 7). The power amplifier preferably has sufficient gain to maintain the combined VCO oscillating at both frequency bands, e.g. both for even and odd mode.

The thus described dual band VCO provides a voltage controlled oscillator with improved phase noise performance as compared to known solutions.

The provided switchers control the operating mode of the coupled transmission line pair, namely, when the switcher is on, the coupled transmission line pair TL1, TL2 operates at even mode $f_{even}$ and the mutual inductance M is positive. Consequently, the coupled VCO works at low frequency band (see Equation 1). Opposite, when the switcher is off, the coupled transmission line pair TL1, TL2 operates in odd mode $f_{odd}$ and the mutual inductance M is negative. Thus, the combined VCO works in a high frequency band.

By modifying the mutual inductance M of the coupled transmission lines TL1, TL2 the frequency difference between the two modes of operation is varied. The mutual inductance M depends on the distance between the two coupled transmission lines TL1, TL2, the length of the coupled part and the location of the transmission lines. In other words, how far apart the transmission lines are, how long the transmission lines are, and if the transmission lines are co-planar and/or stacked.

By utilizing the combination of two coupled VCOs and a mutual inductance induced transmission line pair, it is possible to vary the oscillation frequency band of the entire voltage controlled oscillator, and to synchronize the two single VCOs.

Figure 8:
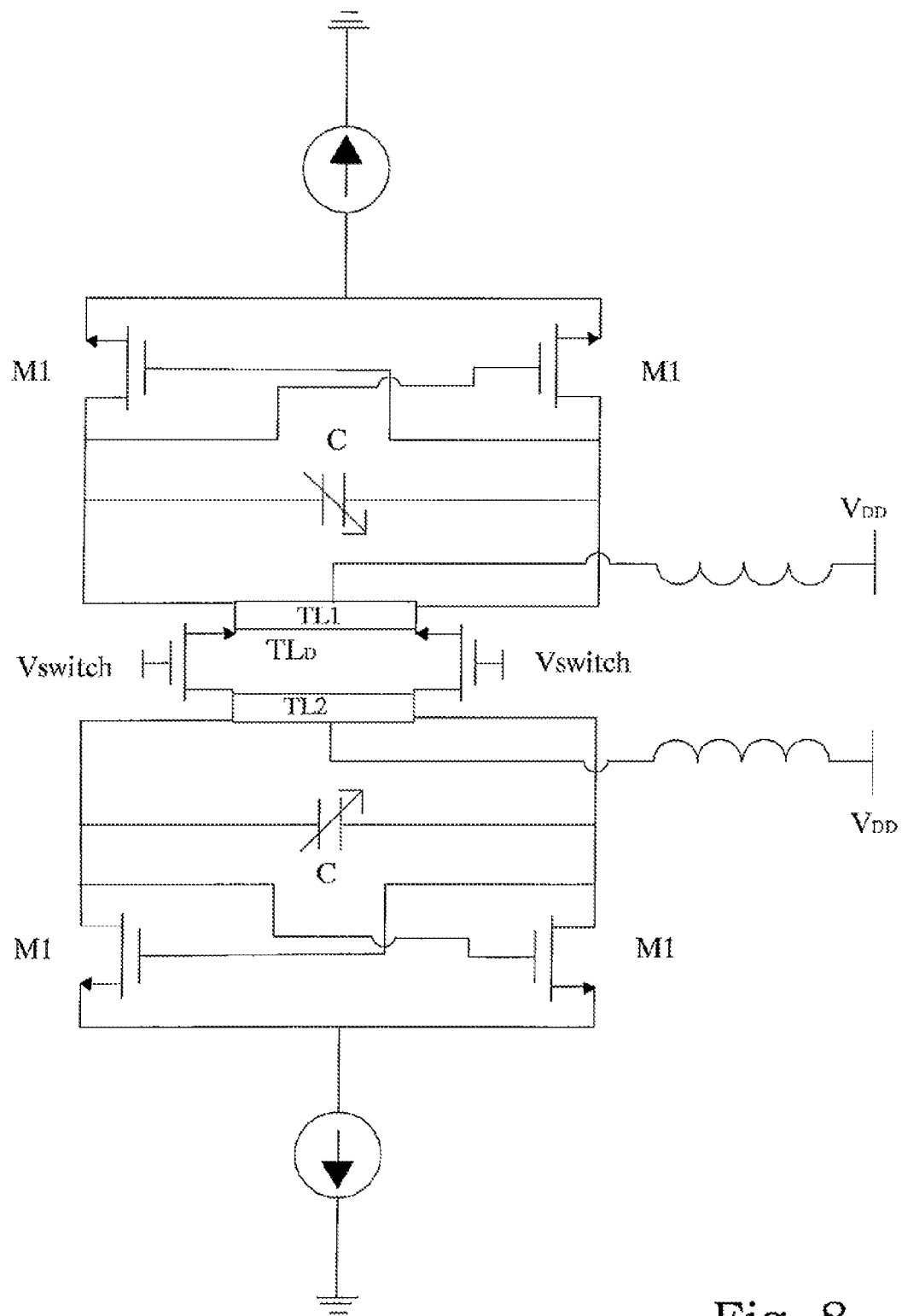
FIG. 8 is an illustration of a cross-coupled dual-band VCO according to an embodiment of the present invention.
Figure 9:
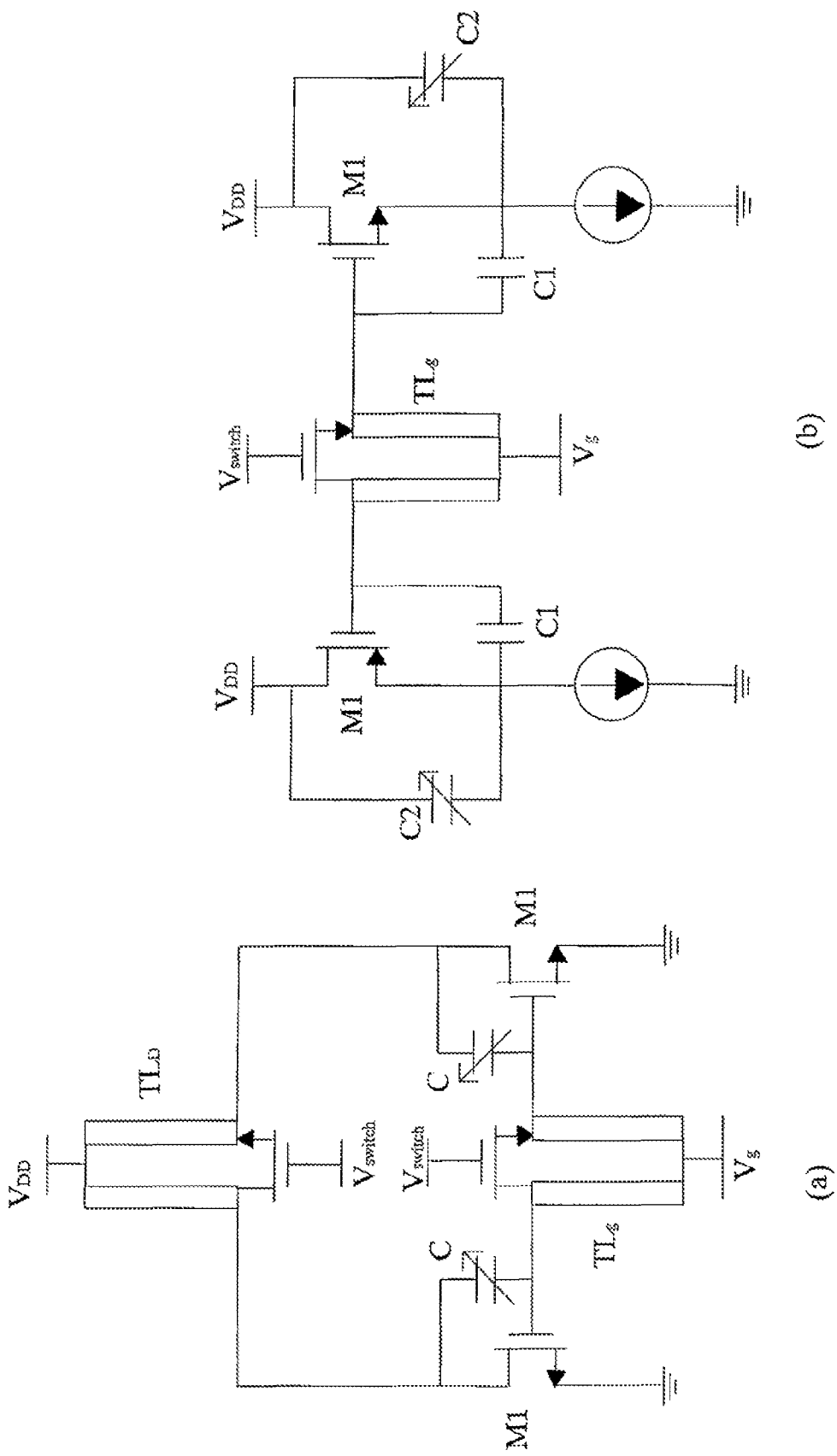
FIG. 9a is an illustration of a Hartley VCO according to an embodiment of the present invention.
FIG. 9b is an illustration of a Colpitts VCO according to an embodiment of the present invention.

With reference to FIGS. 8, 9a, 9b, the concept of the combination of synchronized voltage controlled oscillators and coupled transmission lines can be applied to various types of voltage controlled oscillators and combinations of such oscillators.

According to one embodiment, with reference to FIG. 8, two cross-coupled VCOs are synchronized and coupled via a mutual inductance transmission line pair $TL_D$. The switching of the operational mode of the transmission line pair $TL_D$ is enabled by means of two switchers $V_{SWITCH}$ connecting respective first and second terminals of the transmission lines TL1, TL2.

According to a further embodiment, with reference to FIG. 9a, a dual-band Hartley VCO comprises two Hartley voltage controlled oscillators coupled via two pairs of transmission lines $TL_D$, $TL_g$, each provided with a switch $V_{switch}$.

Yet a further embodiment, with reference to FIG. 9b, discloses a dual-band Colpitts VCO comprising two Colpitt voltage controlled oscillators synchronized and coupled via a coupled transmission line pair $TL_g$. The operational mode of the transmission line pair is enabled using a switch connected between first terminals of the transmission line pair.

In addition, but not shown, the present invention can be applied to a dual band voltage controlled oscillator comprising at least two Clapp VCOs. Because all the above VCOs have a LC resonator, the inductor or a part of an inductor can be coupled, to build a dual-band VCO.

Figure 10:
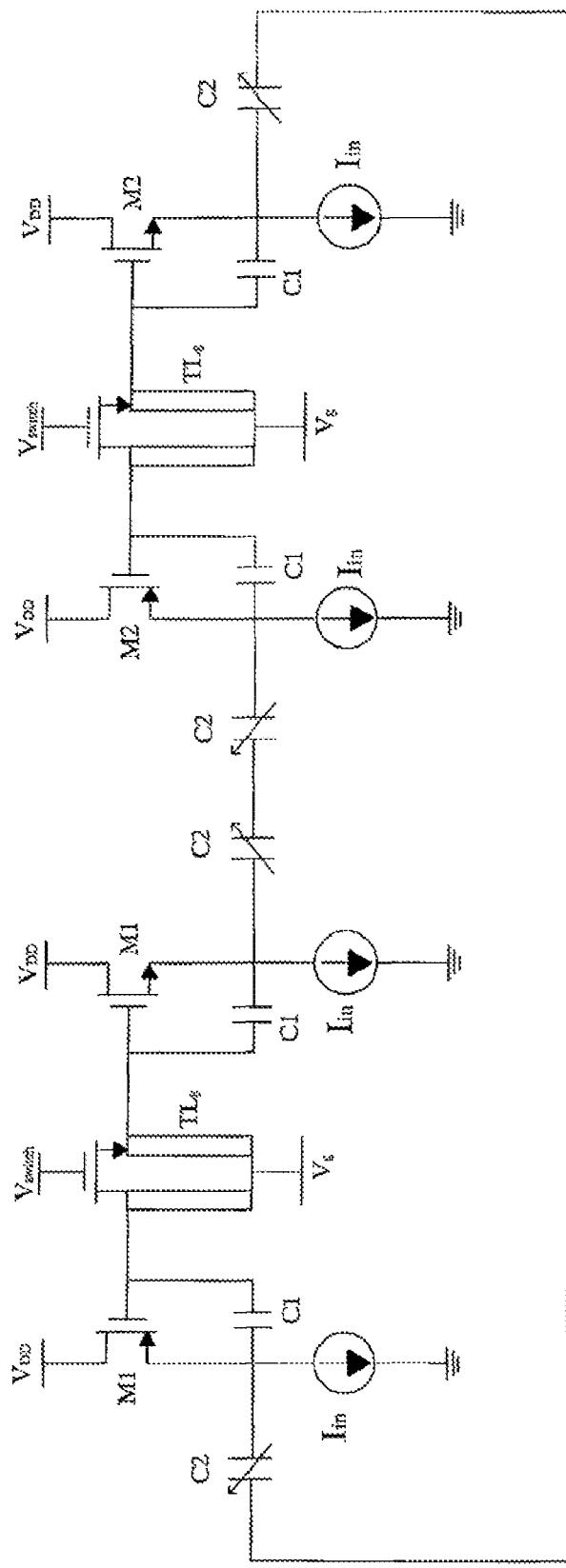
FIG. 10 is an illustration of a differential dual-band Colpitts VCO according to an embodiment of the present invention.

With reference to FIG. 10, the general concept of the present invention can be used to construct differential VCOs, to provide differential signals regardless of the operational mode of the coupled transmission lines. The example, as shown in FIG. 10, is based on two synchronized dual-band Colpitts VCO according to the present invention, each comprising two synchronized Colpitt VCOs and a coupled transmission line pair $TL_g$ and switches at said transmission lines. In this embodiment, transistors M1 and M2 always operate differentially and the differential signal can be provided at their base or emitter. It should be noted that also the cross-coupled dual-band VCO disclosed in FIG. 8 can be arranged to deliver a differential signal.

According to a further embodiment and aspect of the present invention, it is equally possible to utilize the synchronized voltage controlled oscillators and the coupled transmission lines, but without providing actual switchers arranged at the transmission lines. Instead, the power amplifier gain for each VCO is switched or varied between different frequency bands. Thus, the combined VCO can be forced to oscillate at only one frequency band. Since at this oscillation frequency band only the VCOs loop gain can be larger than or equal to 1 to fulfill the oscillation condition. That frequency corresponds to one operational mode of the coupled transmission lines. At another oscillation frequency band or transmission line operational mode, the power gain is too small to provide the VCO oscillation.

Figure 11:
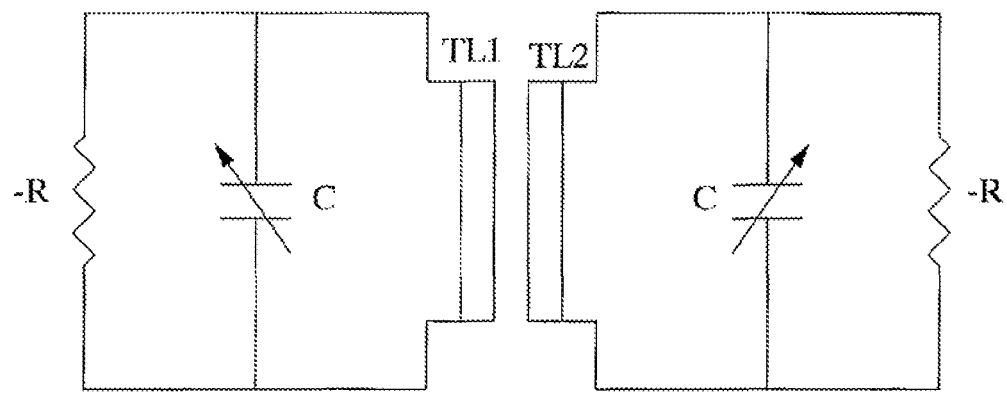
FIG. 11 is an illustration of a dual-band VCO according to an embodiment of the present invention.
Figure 12:
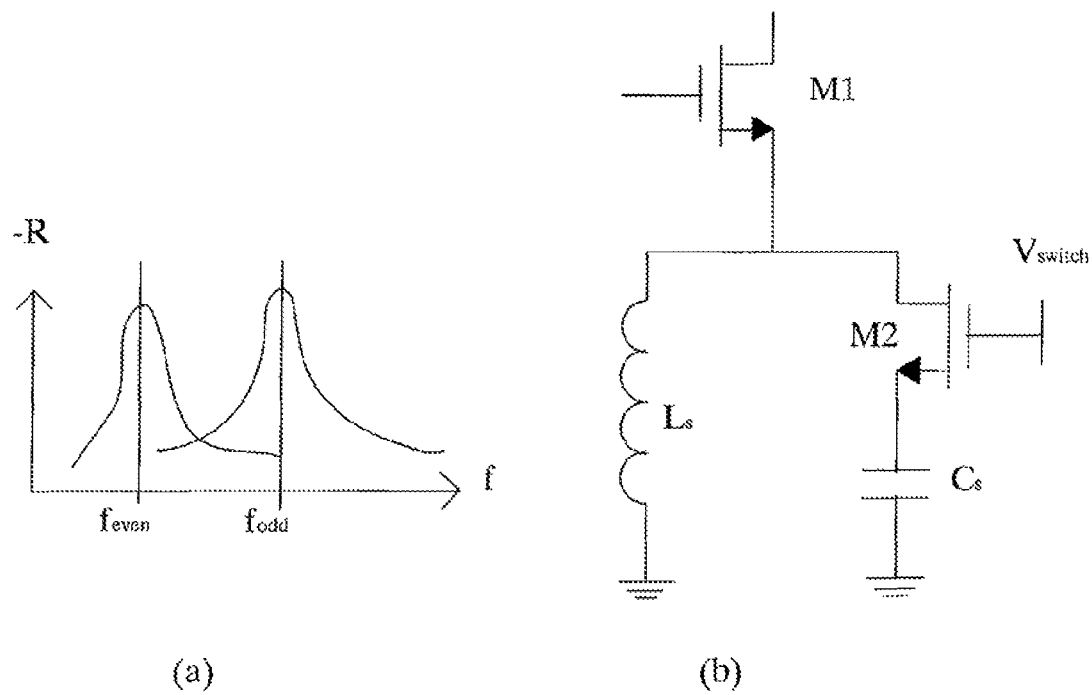
FIG. 12a is a graph showing the frequency response from the negative resistance.
FIG. 12b illustrates a dual-band amplifier useable in combination with embodiments of the present invention.

A simplified schematic of the proposed amplifier gain switching solution is illustrated in FIG. 11. A dual-band amplifier is required for each voltage controlled oscillator VCO1, VCO2, in order to provide a power gain to maintain the combined VCO operating at one frequency band, as shown in the diagram in FIG. 12a. In principle, any dual-band amplifier can be used, provided that it can be switched. For example, in FIG. 12b a switched dual-band amplifier is illustrated, where the switched source degeneration is used to control the gain at different frequency bands.

The embodiment comprises parallel-connected inductor $L_s$ and capacitor $C_s$ (and the parasitic capacitor of the switcher M2) that constitute a resonator circuit which has a resonation frequency $f_{even}$ $$f_{even} = \frac{1}{2\pi\sqrt{(L_{s,i} + M)C}} \quad (2)$$

Thus, when switcher M2 is on, the resonator has the largest impedance at $f_{even}$ and causes the amplifier to have its lowest gain at $f_{even}$. At high frequency, the resonator becomes capacitive with a quite low impedance, and consequently the amplifier has a high gain. In this case, the voltage controlled oscillator will operate at $f_{odd}$, high frequency band. Alternatively, when switching M2 off, the inductor Ls becomes the source degeneration whose impedance increases with frequency, therefore the amplifier exhibits high gain at $f_{even}$ even and low gain at $f_{odd}$. In this case, the VCO will oscillate at $f_{even}$ low frequency band.

Figure 13:
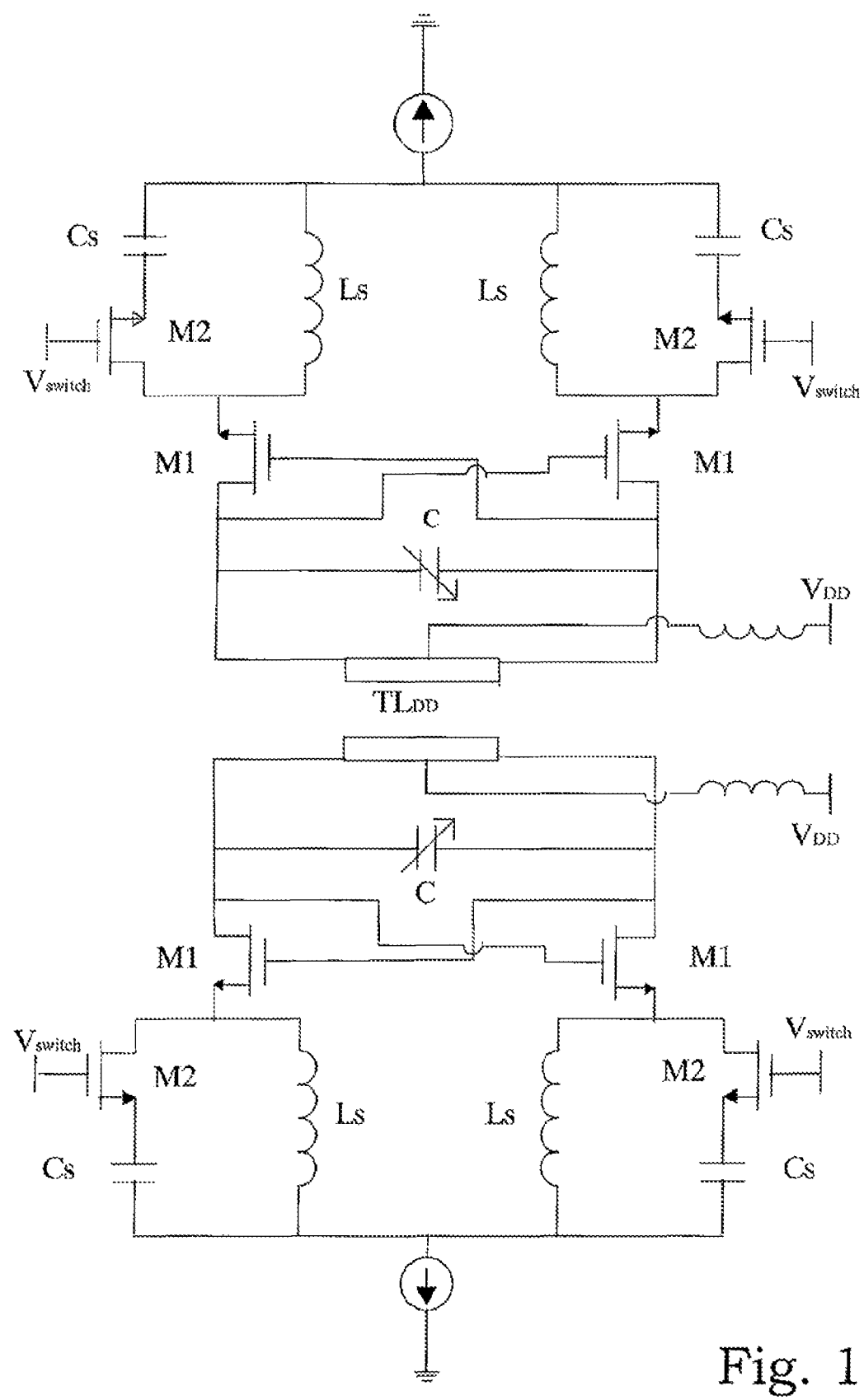
FIG. 13 illustrates a dual-band cross-coupled VCO according to an embodiment of the present invention.
Figure 14:
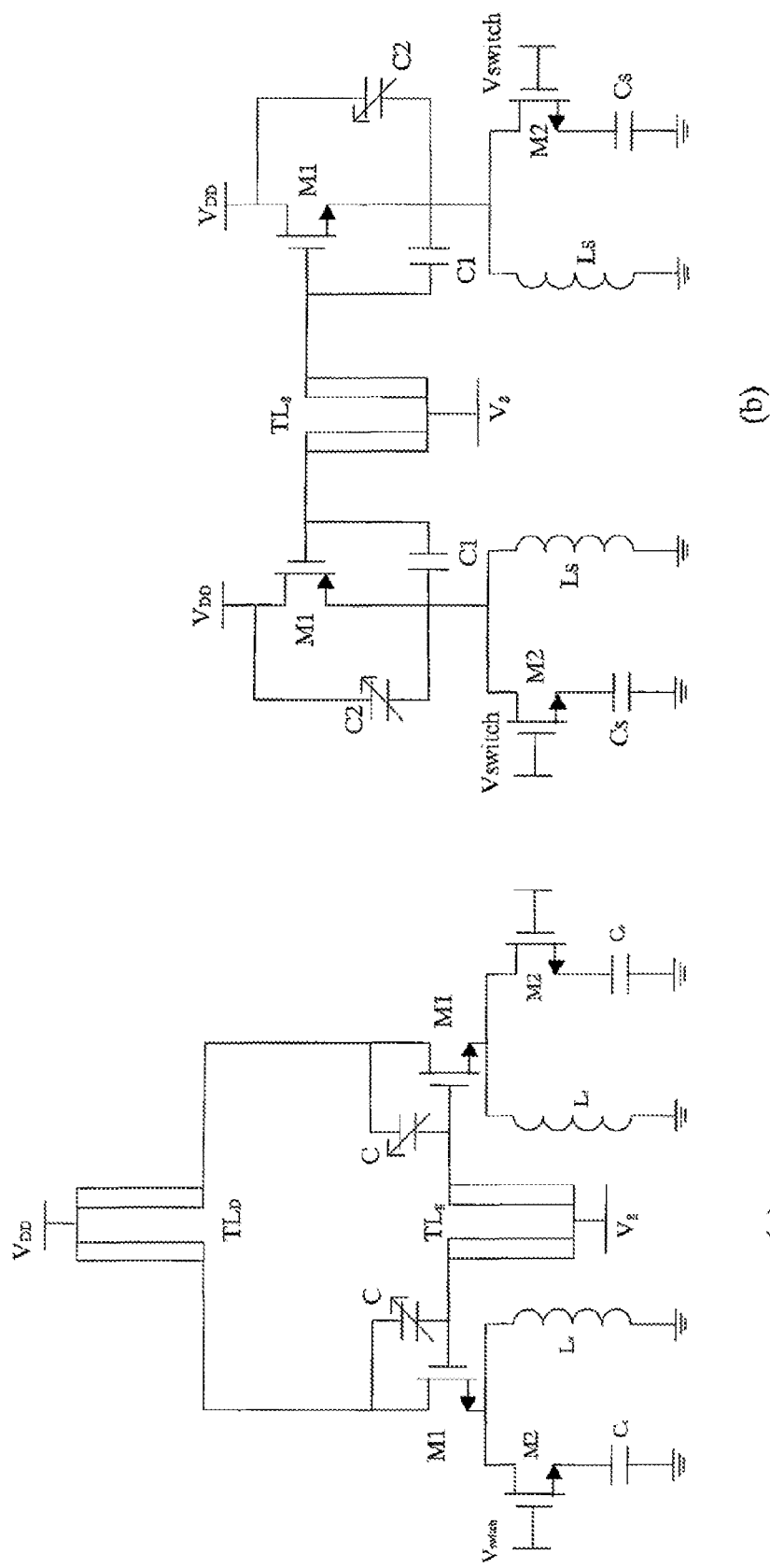
FIG. 14a illustrates a dual-band Hartely VCO according to an embodiment of the present invention.
FIG. 14b illustrates a dual-band Colpitts VCO according to an embodiment of the present invention.

Consequently, the dual band switching of the proposed VCO is realized by altering the frequency response of the amplifier gain. In a similar manner as the previously described switching embodiments, this can be applied to different VCO topologies. Especially, the concept can be applied to the same set up of synchronized voltage controlled oscillators as described with reference to FIGS. 8-10, but without the provided switches at the transmission lines. Instead the switching is provided via switched power amplifiers provided at the respective VCOs. With reference to FIG. 13, 14a, 14b, a dual-band cross coupled VCO (FIG. 13), a dual-band Hartley VCO (FIG. 14a), a dual-band Colpitts VCO (FIG. 14b), etc.

Figure 15:
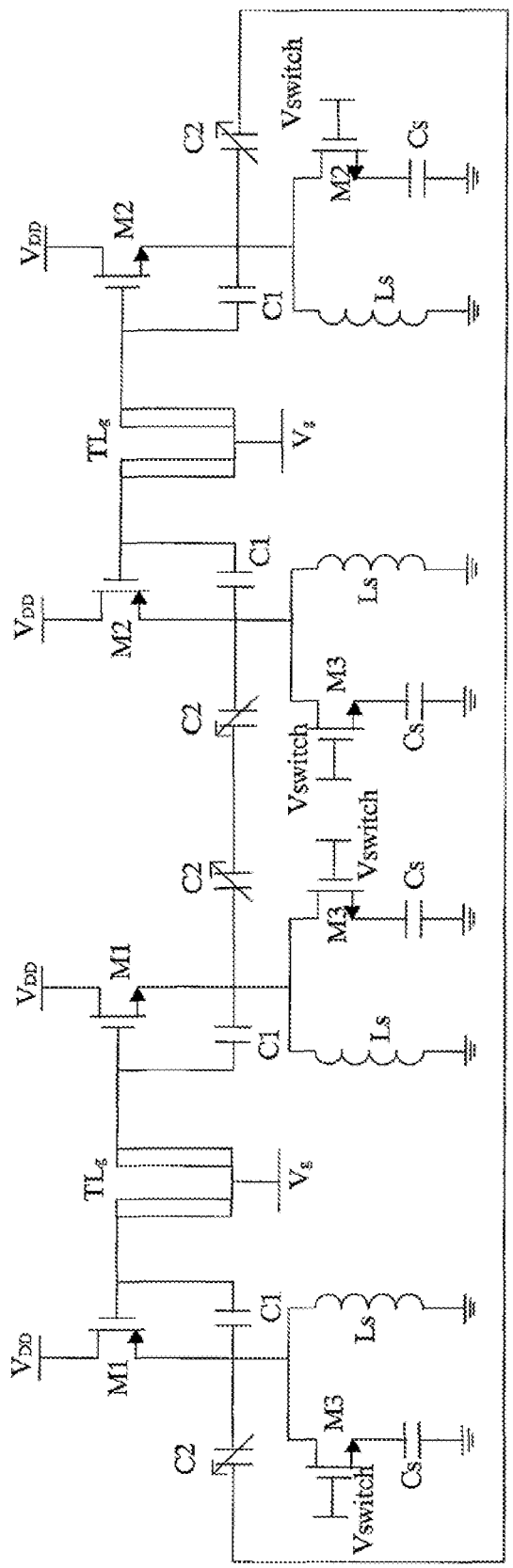
FIG. 15 illustrates a differential dual-band Colpitts VCO according to the present invention.

Finally, the proposed dual-band VCO can be used to construct differential VCOs, to generate differential signals for both transmission lines modes. As illustrated in FIG. 15, two dual-band Colpitts VCO are synchronized and the differential signal can be taken from the base or emitter of transistors M1 and M2. Moreover, the dual-band cross-coupled VCO in FIG. 13 can be utilized to provide differential signals.

Advantages of the various embodiments of the present invention comprise:

When using the switcher(s) across the coupled transmission lines, regardless if the switcher is either on or off, the current through each switcher is very small, thus, the power dissipation on the switcher is very small. This means the degraded Q due to switcher can be ignored. This gives the proposed VCO an advantage of better phase noise performance over the dual-band VCOs using switched inductors or capacitors, or switched mutual inductance. In the latter case, there is a large ac current flowing through the switcher, when the switcher is on. It can result in degraded Q of the resonator.

When using the dual-band switched power amplifier, the switcher itself is not a part of VCO's resonator. Consequently, the VCO's phase noise does not sensitive to the switcher's parasitic resistance and capacitance.

In the proposed VCO, two coupled VCOs are synchronized, which has of benefit to reducing the phase noise. In contrast, the dual-band VCO utilizing switched bias [5], [6] has only one working VCO at one time. The standing by VCO makes no contribution to reducing phase noise, instead, the parasitic resistance and capacitance of the active devices can reduce the resonator Q, thus, increase phase noise.

It will be understood by those skilled in the art that various modifications and changes may be made to the present invention without departure from the scope thereof, which is defined by the appended claims.

REFERENCES

[1] A. Mazzanti, P. Uggetti, R. Battaglia, and F. Svelto, "Analysis and design of a dual-band reconfigurable VCO", Proc. Of the 2004 11$^{th}$ IEEE Electronics, Circuits and Systems, pp. 37-41, 2004.

[2] S. S. Broussev, T. A. Lehtonen, and N. T. Tchamov, "A wideband low phase noise LC-VCO with programmable $K_{VCO}$", IEEE Microwave and Wireless Components Letters, 2007.

[3] J. Cabanillas, "Coupled-inductor multi-band VCO", patent number: US2006/0033587 A1.

[4] R. S. Kaltenecker, "Optimum RF VCO structure", U.S. Pat. No. 6,943,635 B1.

[5] A. Bevilacqua, F. P. Pavan, C. Sandner, A. Gerosa, and A. Neviani, "Transformer-based dual-mode voltage-controlled oscillators", IEEE Trans. on Circuits and Systems-II, 2007

[6] D. Back, J. Kim, and S. Hong, "A dual-band (13/22-GHz) VCO based on resonant mode switching", IEEE Microwave and Guided Wave Letters, Vol. 13, No. 10, pp. 443-445, October, 2003

[7] H. Jacobsson et al. "Very low phase-noise fully integrated coupled VCOs", in Proc. IEEE Radio Frequency Integrated Circuits Symp. 2002, pp. 577-585.

APPENDIX 1

Mutual Inductance

Mutual inductance M is the concept that the current through one inductor can induce a voltage in another nearby inductor. It is important as the mechanism by which transformers work, but it can also cause coupling between conductors in a circuit.

The mutual inductance M is also a measure of the coupling between two inductors. The mutual inductance by circuit i on circuit j is given by the double integral Neumann formula $$M_{ij} = \frac{\mu_0}{4\pi} \oint_{C_i} \oint_{C_j} \frac{ds_i ds_j}{|R_{ij}|}$$

Dot Convention

Figure 1:
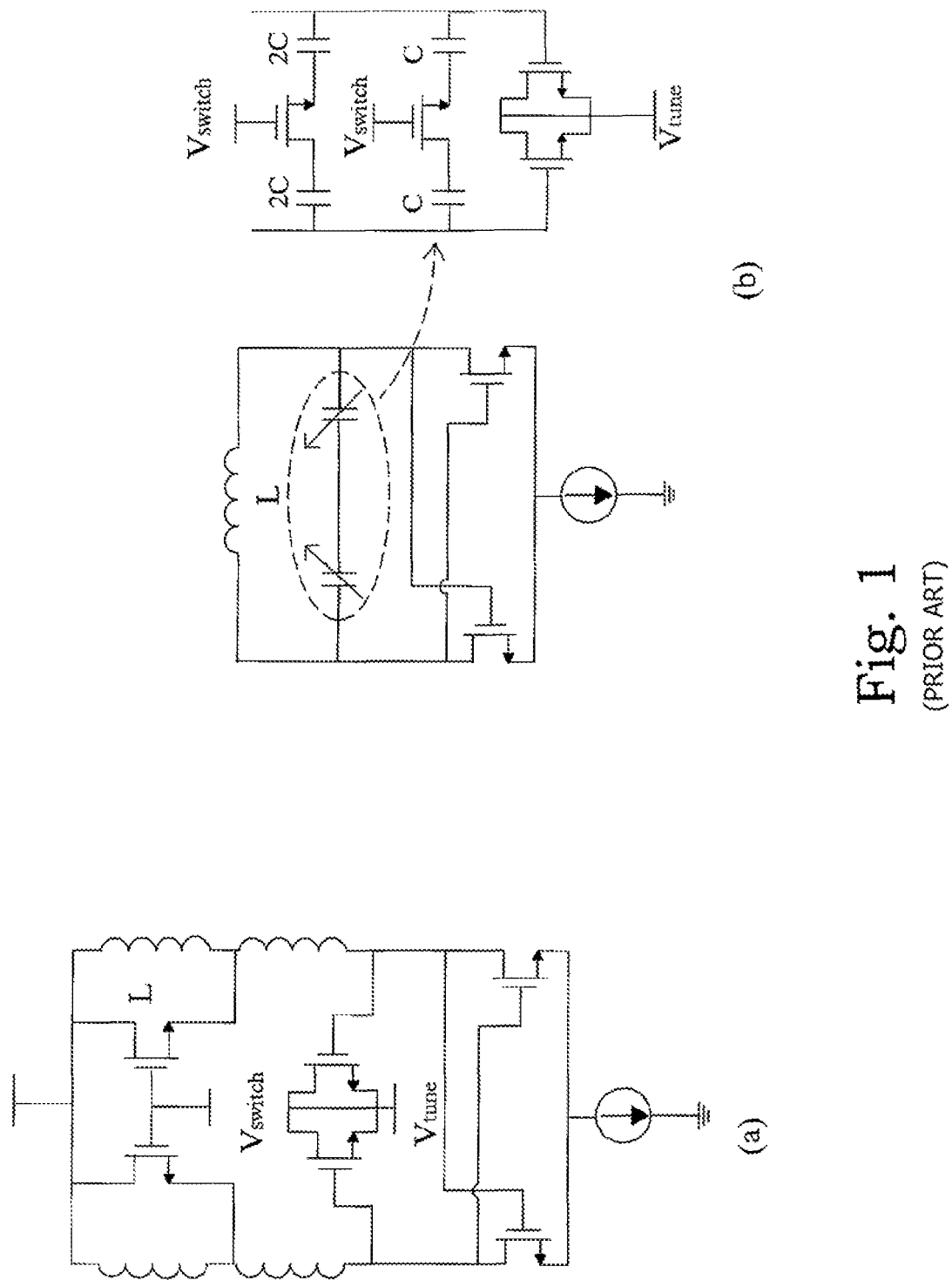
FIG. 1a is an illustration of a known reconfigurable dual-band voltage controlled oscillator.
FIG. 1b is an illustration of another known reconfigurable dual-band voltage controlled oscillator.
Figure 2:
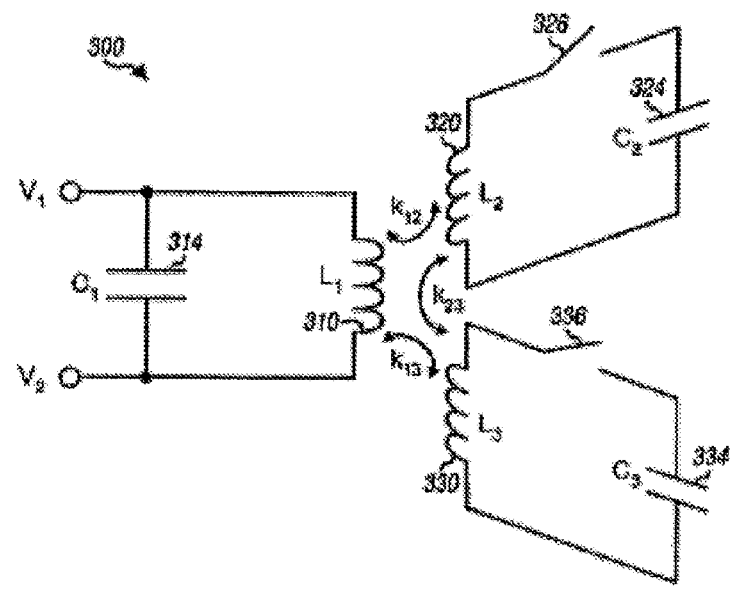
FIG. 2 is an illustration of a known switched resonator.
Figure 3:
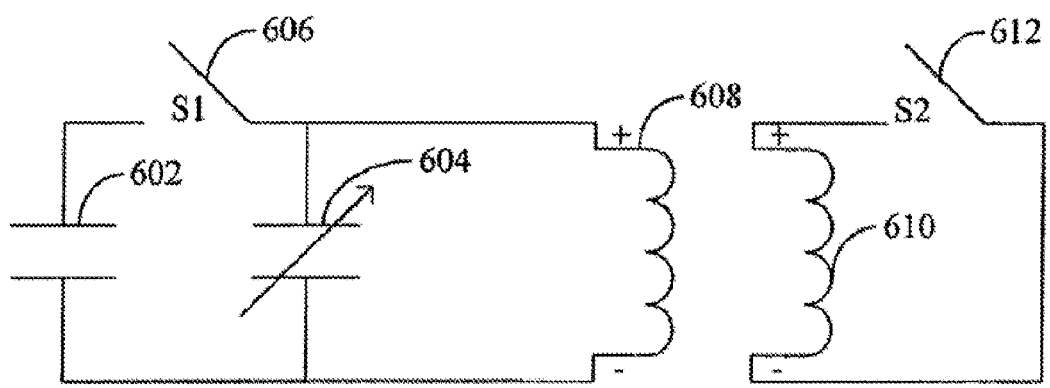
FIG. 3 is an illustration of a further known switched resonator.
Figure 4:
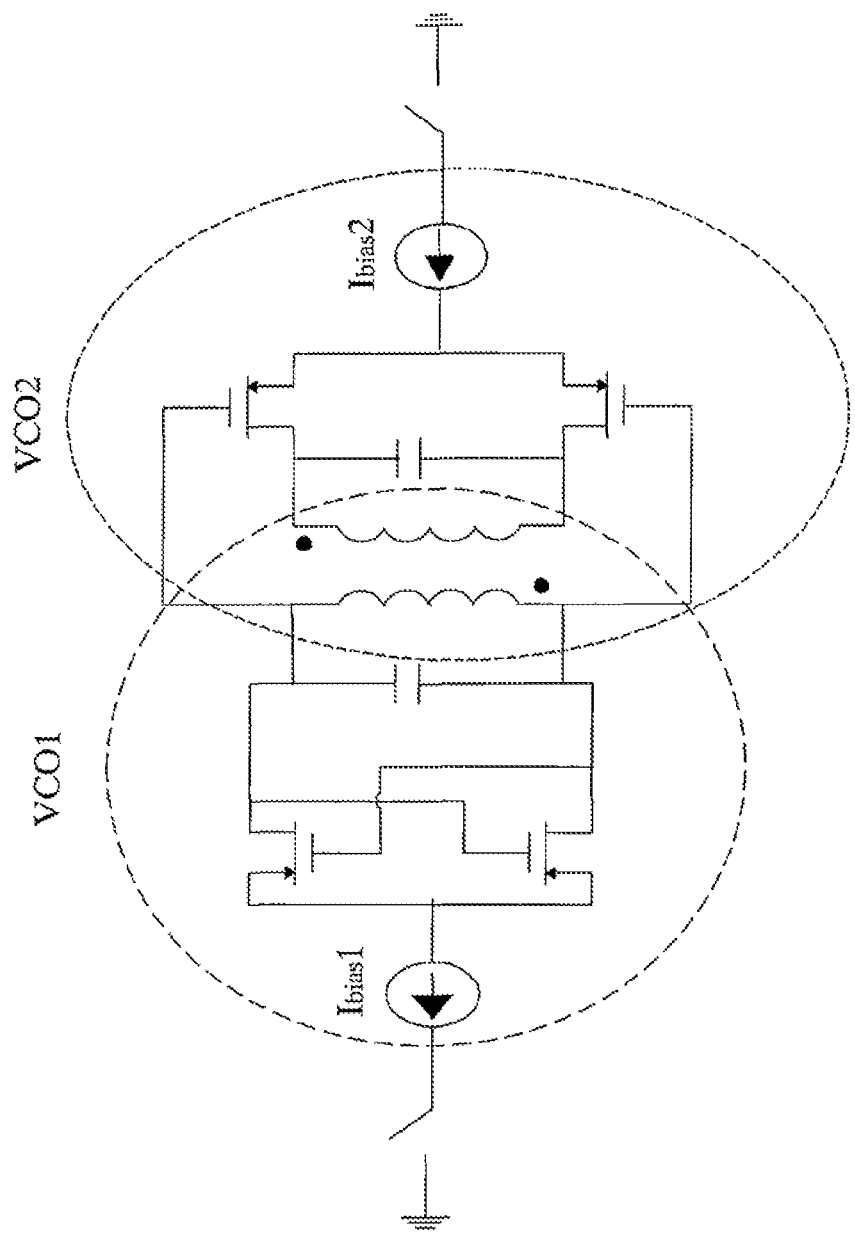
FIG. 4 is an illustration of a known dual-band VCO.
Figure 5:
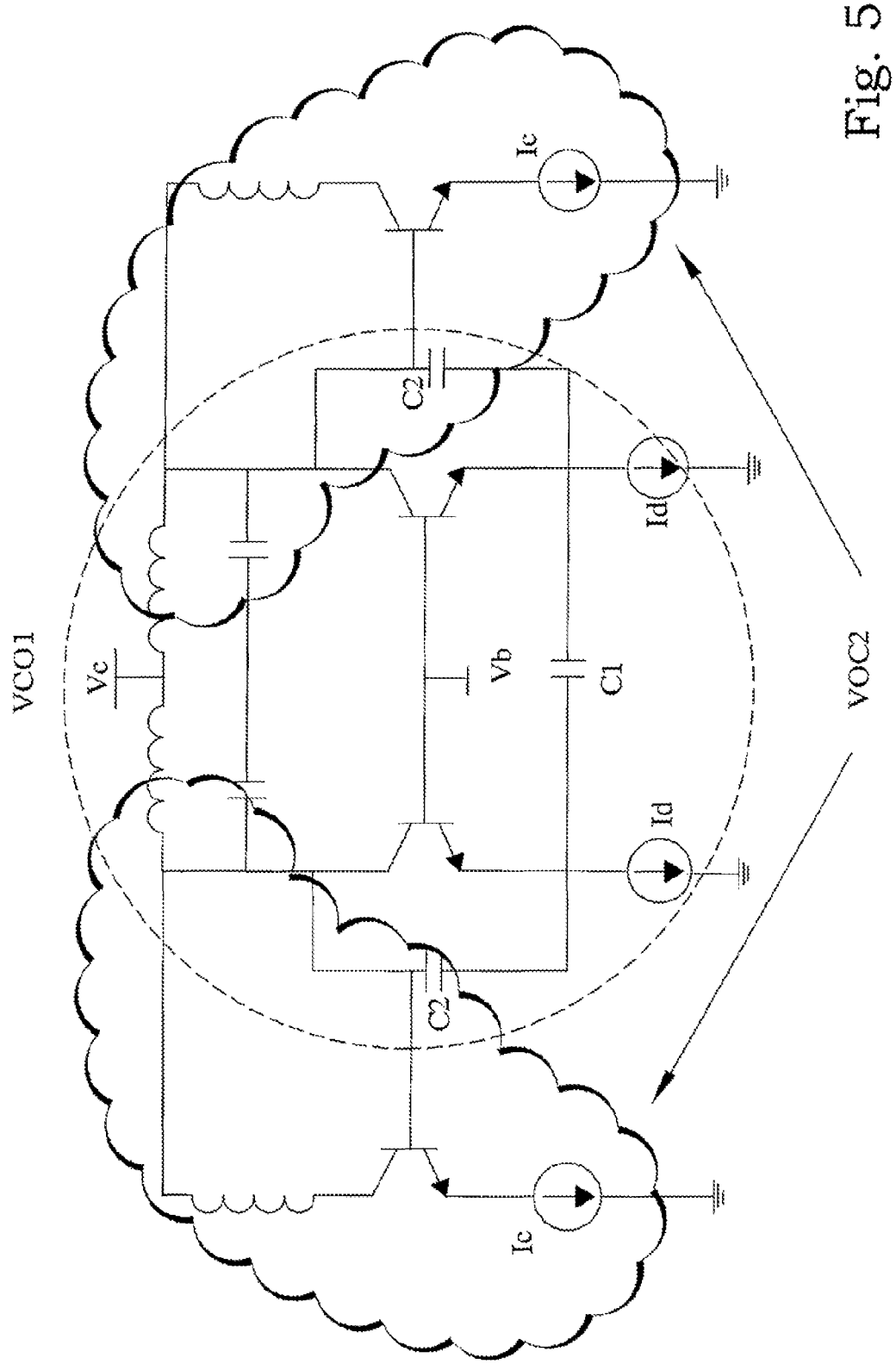
FIG. 5 is an illustration of another known dual-band VCO

In circuit analysis, the dot convention is used to denote the voltage polarity of the mutual inductance of two components. (Reference is made to FIG. 4 *of* this disclosure).

Two good ways to think about this convention:
1. The current goes into one dot (either dot) "tries" to come out of the other dot. "Into" meaning from the dot toward the inductor, and conversely "out" meaning from the inductor toward the dot.
2. Current going into a dotted terminal of the inductor induces a positive voltage at the other dot. Conversely, current leaving a dotted terminal induces a negative voltage at the other dot.

What is claimed is:

1. A dual band capable voltage controlled oscillator (VCO) circuit, comprising:
 two voltage controlled oscillator units; and
 at least two transmission lines, wherein the two voltage controlled oscillator units are synchronized and coupled to each other via the at least two transmission lines, the at least two transmission lines being arranged to operate according to one of two modes to enable varying a combined inductance of the synchronized two oscillator units and an oscillation frequency of the VCO circuit.

2. The circuit according to claim 1, wherein the transmission lines are configured to operate at an even mode or an odd mode.

3. The circuit according to claim 1, further comprising at least one switching unit arranged at said transmission lines to enable switching between said two modes.

4. The circuit according to claim 1, further comprising two switching units arranged at and coupling a respective first terminal and second terminal of said coupled transmission lines.

5. The circuit according to claim 3, wherein said at least one switching unit is arranged at and coupled to a central portion of each of said two coupled transmission line.

6. The circuit according to claim 1, further comprising switching units that control power gain of an amplifier in each voltage controlled oscillator.

7. The circuit according to claim 6, wherein the power gain is configured to maintain VCO oscillation at any one of said two modes of operation.

8. A dual band capable voltage controlled oscillator (VCO) circuit, comprising:
 two voltage controlled oscillator units; and
 at least two coupled transmission lines, wherein the two voltage controlled oscillator units are synchronized and coupled to each other via the at least two coupled transmission lines, the at least two coupled transmission lines being coupled to one another and arranged to operate according to one of two modes to enable varying a combined inductance of the synchronized two oscillator units and an oscillation frequency of the VCO circuit.

* * * * *

UNITED STATES PATENT AND TRADEMARK OFFICE
CERTIFICATE OF CORRECTION

PATENT NO. : 8,125,282 B2
APPLICATION NO. : 12/739012
DATED : February 28, 2012
INVENTOR(S) : Bao et al.

It is certified that error appears in the above-identified patent and that said Letters Patent is hereby corrected as shown below:

In Column 3, Line 23, delete "$L_i=L_{s,j}+M;$" and insert -- $L_i=L_{s,i}+M;$ --, therefor.

In Column 3, Line 24, delete "$L_i=L_{s,j}-M.$" and insert -- $L_i=L_{s,i}-M.$ --, therefor.

Signed and Sealed this
Twenty-sixth Day of June, 2012

David J. Kappos
*Director of the United States Patent and Trademark Office*